United States Patent
Chou et al.

[19]

[11] Patent Number: 5,914,519
[45] Date of Patent: Jun. 22, 1999

[54] AIR-GAP SPACER OF A METAL-OXIDE-SEMICONDUCTOR DEVICE

[75] Inventors: Jih-Wen Chou, Hsinchu; Tony Lin, Kao Hsiung Hsien, both of Taiwan

[73] Assignee: United Microelectronics Corp., Taiwan

[21] Appl. No.: 09/009,302

[22] Filed: Jan. 20, 1998

[30] Foreign Application Priority Data

Jul. 26, 1997 [TW] Taiwan .................................. 86110632

[51] Int. Cl.⁶ ............................ H01L 29/14; H01L 29/76
[52] U.S. Cl. ........................ 257/410; 257/408; 438/305
[58] Field of Search ................................ 257/408, 410; 438/305

[56] References Cited

U.S. PATENT DOCUMENTS

| | | | |
|---|---|---|---|
| 5,736,446 | 4/1998 | Wu | 438/305 |
| 5,770,507 | 6/1998 | Chen et al. | 438/305 |

*Primary Examiner*—Valencia Martin-Wallace
*Attorney, Agent, or Firm*—Rabin & Champagne, P.C.

[57] ABSTRACT

An air-gap spacer of a metal-oxide-semiconductor device comprises a spacer and a cross-sectional L-shaped air-gap. The spacer is adjacent to a sidewall of the gate electrode but not directly contacts to the gate electrode. The cross-sectional L-shaped air-gap is located between the spacer and the gate electrode and between the spacer and the substrate so that the spacer is separated from the gate electrode and the spacer is partially separated from the substrate.

3 Claims, 4 Drawing Sheets

AIR-GAP SPACER OF A METAL-OXIDE-SEMICONDUCTOR DEVICE

BACKGROUND OF THE INVENTION

1. Field of the Invention

The invention relates in general to a metal-oxide-semiconductor device (MOS), and more particularly to a MOS device, having an air-gap between the gate electrode and the spacer.

2. Description of the Related Art

In order to avoid short-channel effect, lightly doped drain (LDD) structure is frequently utilized in a MOS device. Referring to FIG. 1, LDD structure 11 contains a lightly doped region located at a region between the source/drain region 15 and the gate electrode 12 at the substrate 10 surface. However, the existence of the spacer 13 between the gate electrode 12 and the LDD region 11 results in an overlap capacitor 14, which is easy to cause the misjudgement during data access.

To reduce the overlap capacitor forming between the gate electrode region and LDD region, material with lower dielectric constant is frequently utilized as spacer. Besides, a MOS having an air-gap region between the gate electrode region and the spacer is proposed to prevent the formation of the overlap capacitor. Referring to FIG. 2, a MOS device 20 includes a gate electrode region 21, source/drain regions 22, a LDD region 23 and a spacer 24. The spacer 24 and the gate electrode region 21 are not directly connected but isolated by an air gap region 25. Therefore, the overlap capacitor between the gate electrode region 21 and the LDD region 23 is reduced.

However, the MOS device with the air-gap structure can not completely avoids the formation of the overlap capacitor since the spacer partially contacts with the LDD region.

SUMMARY OF THE INVENTION

It is therefore an object of the invention to provide a MOS device having an L-shaped air-gap region extending onto the surface of the LDD region to reduce the overlap capacitor between the gate electrode and the LDD region.

It therefore another object of the invention to provide a MOS device having an air-gap spacer, wherein a more lightly doped drain can be formed and the short channel effect is avoided.

An air-gap spacer of a metal-oxide-semiconductor device comprises a spacer and a cross-sectional L-shaped air-gap. The spacer is adjacent to a sidewall of the gate electrode but not directly contacts to the gate electrode. The cross-sectional L-shaped air-gap is located between the spacer and the gate electrode and between the spacer and the substrate so that the spacer is separated from the gate electrode and the spacer is partially separated from the substrate.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
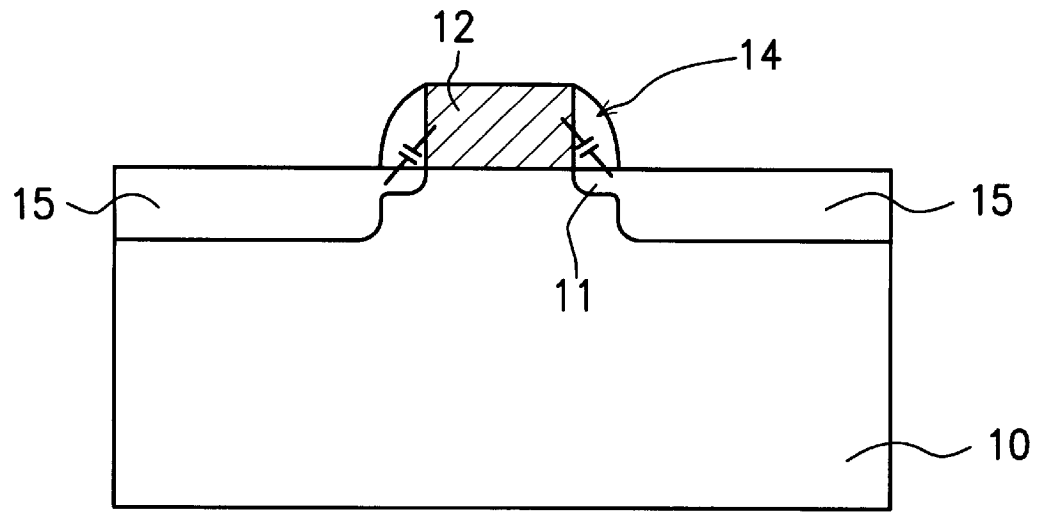
FIG. 1 (Prior Art) is a cross-sectional view showing a conventional MOS device.
Figure 2:
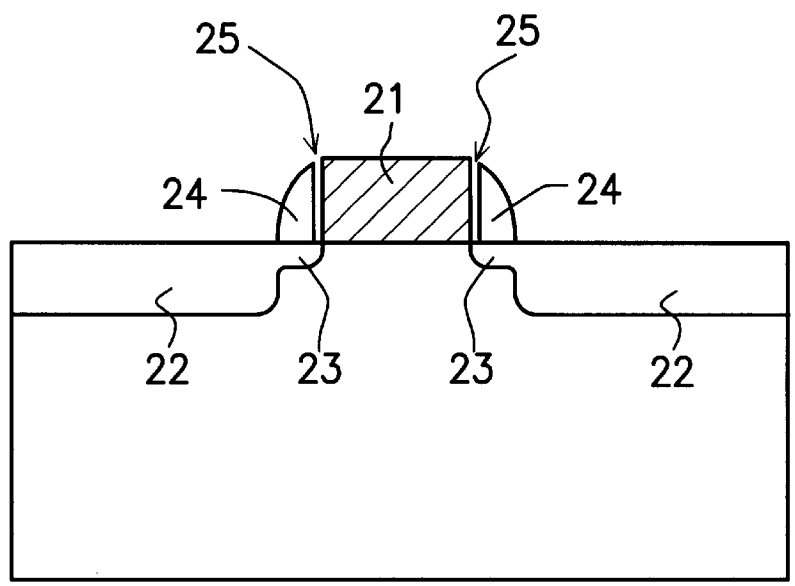
FIG. 2 (Prior Art) is a cross-sectional view showing a conventional MOS device having an air-gap spacer.
Figure 3A:
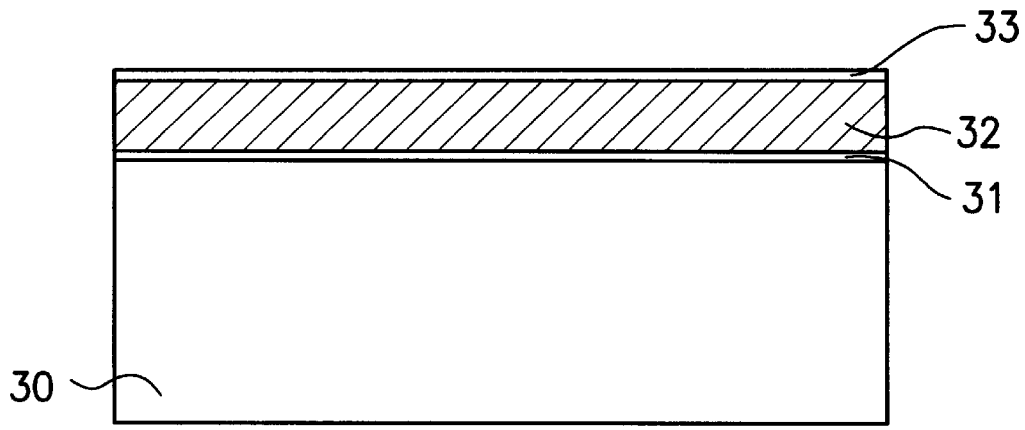
FIGS. 3A to 3G are cross-sectional views showing the process steps of forming a MOS device having an air-gap spacer according to a preferred embodiment of the invention.
Figure 3B:
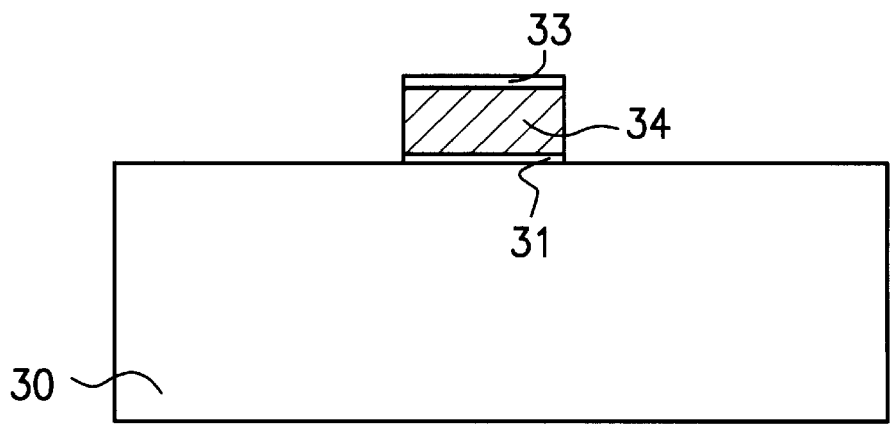

Referring to FIG. 3A, on a substrate 30, a gate oxide layer 31, a polysilicon layer 32, and an anti-reflection layer 33 are successively formed. The anti-reflection layer 33 can be silicon nitrous oxide (SiNO) which benefits the control of the critical dimension (CD) during the further photolithography process. The anti-reflection layer 33, the polysilicon layer 32, and the gate oxide layer 31 are then patterned to form a gate electrode region 34 shown in FIG. 3B.

Figure 3C:
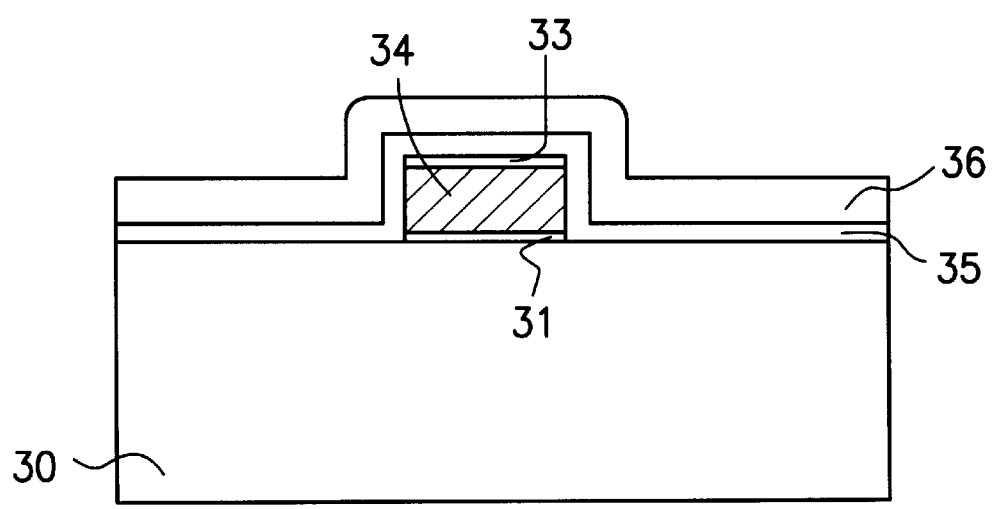
Figure 3D:
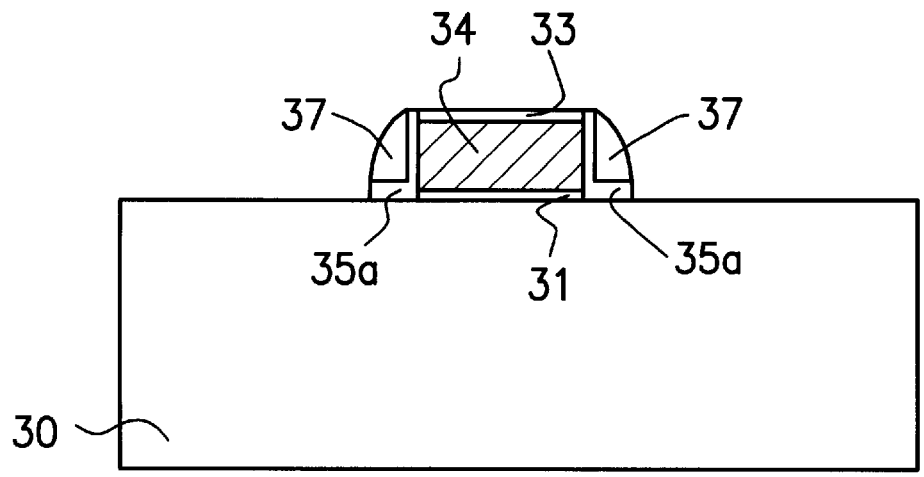

Then, referring to FIG. 3C, a silicon nitride layer 35 is formed on the surface of the substrate 30 and the side exposed surface of the gate electrode region 34, preferably by chemical vapor deposition. Next, an oxide layer 36, such as chemical vapor deposited silicon dioxide, is formed on the surface of the silicon nitride layer 35. Then, the oxide layer 36 and the silicon nitride layer 35 are anisotropically etched back to form a spacer 37 at the sidewall of the gate electrode region 34 and a cross-sectional L-shaped silicon nitride layer 35a between the spacer 37 and the gate electrode region 34 shown in FIG. 3D.

Figure 3E:
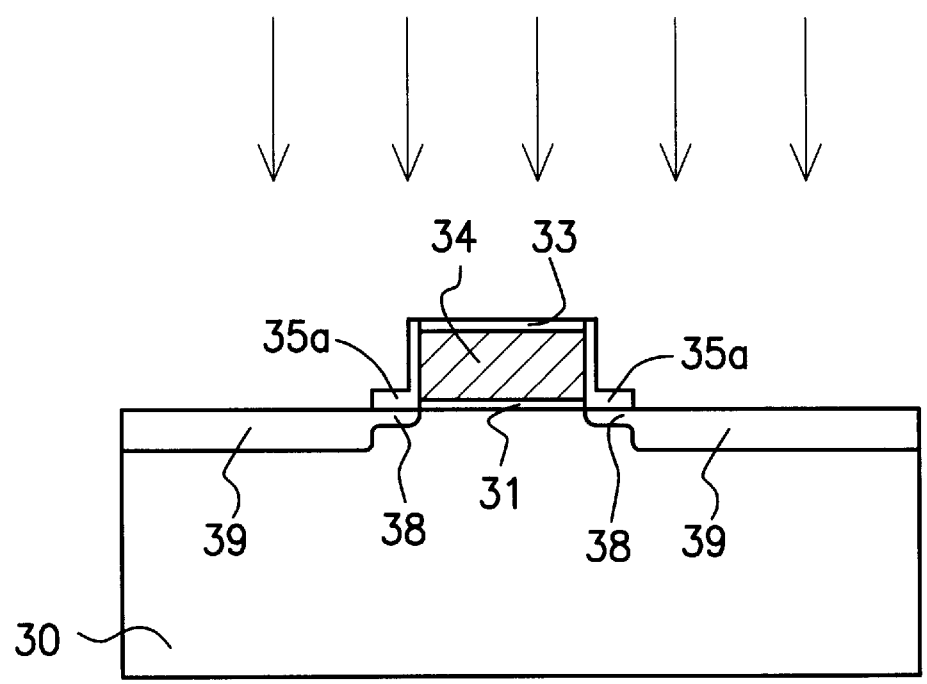

Referring to FIG. 3E, after the spacer 37 is removed, the substrate 30 is process through ion implantation. Consequently, the substrate region covered by the L-shaped silicon nitride layer forms a shallow and more lightly doped diffusion region 38 and the exposed substrate surface forms a deep and less lightly doped diffusion region 39.

Figure 3F:
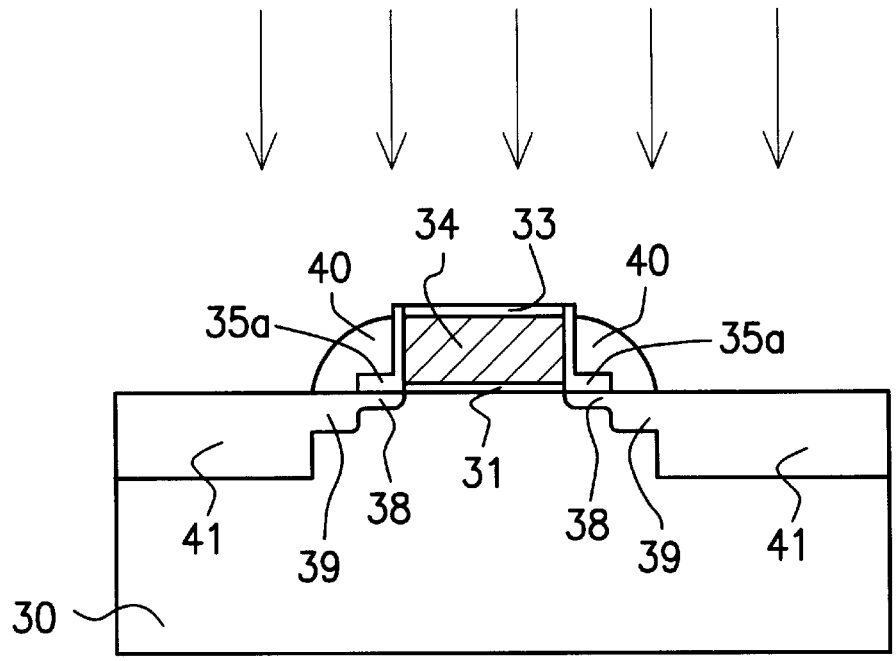

Then, referring to FIG. 3F, a spacer 40, preferably an oxide spacer, is formed at the sidewall of the gate electrode region 34 wherein the spacer 40 must be able to cover the L-shaped silicon nitride layer 35a. The process steps of fabricating the spacer 40 can be similar to the ones of fabricating the spacer 37. Next, the substrate 30 is processed through ion implantation, using the spacer 40 and the gate electrode region 34 as masks, to form the source/drain regions 41.

Figure 3G:
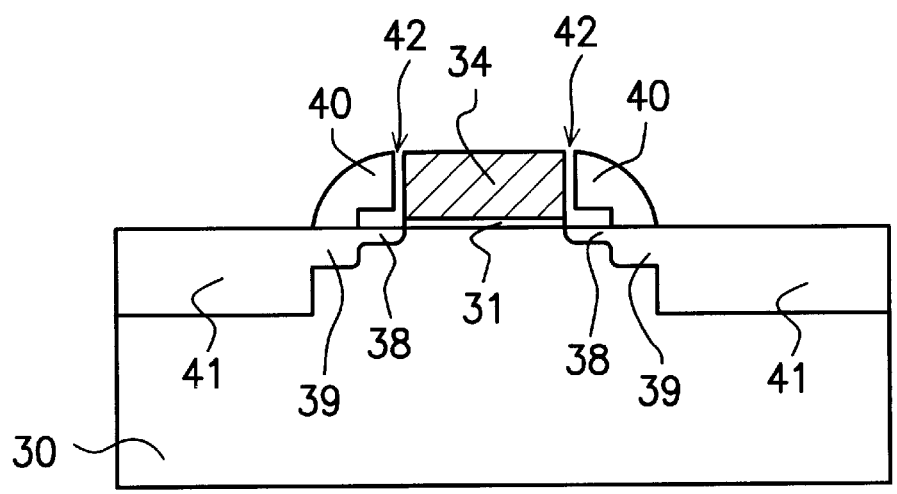

Referring now to FIG. 3G, the L-shaped silicon nitride layer 35a and the anti-reflection layer 33 are removed, using such as hot phosphoric acid solution. Therefore, the L-shaped air-gap region 42 is formed between the gate electrode region 34 and the spacer 40. By now the MOS device with an L-shaped air-gap between the gate electrode region 34 and the spacer 40 is formed. Since the back-end processes are not closely related to the subject of the invention, they will not be described herein.

Using the above-mentioned method forms a MOS device with an L-shaped air-gap. Besides, the source/drain structure is elevated to include two lightly doped regions, one region 38 more lightly doped and closer to the gate electrode region 34 than the other 39. As a result, the overlap capacitor between the source/drain regions is reduced, the short channel effect is improved and the phenomena of punch through is avoided.

While the invention has been described by way of example and terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. An air-gap spacer of a metal-oxide-semiconductor device, wherein the metal-oxide-semiconductor device is formed on a substrate and includes gate electrode on the substrate, at least a lightly doped region adjacent to the gate electrode and in the substrate and a source/drain region in the substrate, the air-gap spacer comprising:

a spacer adjacent to a sidewall of the gate electrode but not directly contacting to the gate electrode; and a cross-sectional L-shaped air gap between the spacer and the gate electrode and between the spacer and the substrate so that the spacer is separated from the gate electrode and the spacer is partially separated from the substrate.

2. A air-gap spacer as claimed in claim 1, further comprising an extended lightly doped region adjacent to the lightly doped region, extending towards the gate electrode.

3. A air-gap spacer as claimed in claim 2, wherein the extended lightly doped region is shallower than the lightly doped region.

\* \* \* \* \*